(12) United States Patent
Suzuki et al.

(10) Patent No.: US 7,368,974 B2
(45) Date of Patent: May 6, 2008

(54) SIGNAL ADDER CIRCUIT CAPABLE OF REMOVING EFFECTS DUE TO PHASE ERROR OR AMPLITUDE ERROR OF I AND Q SIGNALS

(75) Inventors: Takeo Suzuki, Fukushima-ken (JP); Shigeru Osada, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 25 days.

(21) Appl. No.: 11/479,742

(22) Filed: Jun. 30, 2006

(65) Prior Publication Data

US 2007/0046529 A1   Mar. 1, 2007

(30) Foreign Application Priority Data

Aug. 31, 2005  (JP) .............................. 2005-251187

(51) Int. Cl.
*G06F 7/44* (2006.01)
(52) U.S. Cl. ....................................... 327/512; 327/362
(58) Field of Classification Search ......... 327/355–361
See application file for complete search history.

(56) References Cited

U.S. PATENT DOCUMENTS 4,100,496 A * 7/1978 Akiyoshi et al. ........ 455/276.1

6,133,773 A * 10/2000 Garlepp et al. ............. 327/247

FOREIGN PATENT DOCUMENTS

| JP | 10-136048 | 5/1998 |
| JP | 2000-332841 | 11/2000 |

* cited by examiner

*Primary Examiner*—Dinh T. Le
(74) *Attorney, Agent, or Firm*—Beyer Law Group LLP

(57) ABSTRACT

A signal adder circuit includes: an adding unit that includes at least a pair of amplification elements in which a constant current flows between ground terminals and a ground, input signals having different phases are input to input terminals, and output terminals to which a power supply voltage is applied are connected to each other; a gain control unit that is provided between the ground and each of the ground terminals of the amplification elements so as to adjust the amplitudes of the input signals having different phases; and a phase control unit that is provided between the ground and each of the ground terminals of the amplification elements so as to adjust the phases of the input signals having different phases.

6 Claims, 3 Drawing Sheets

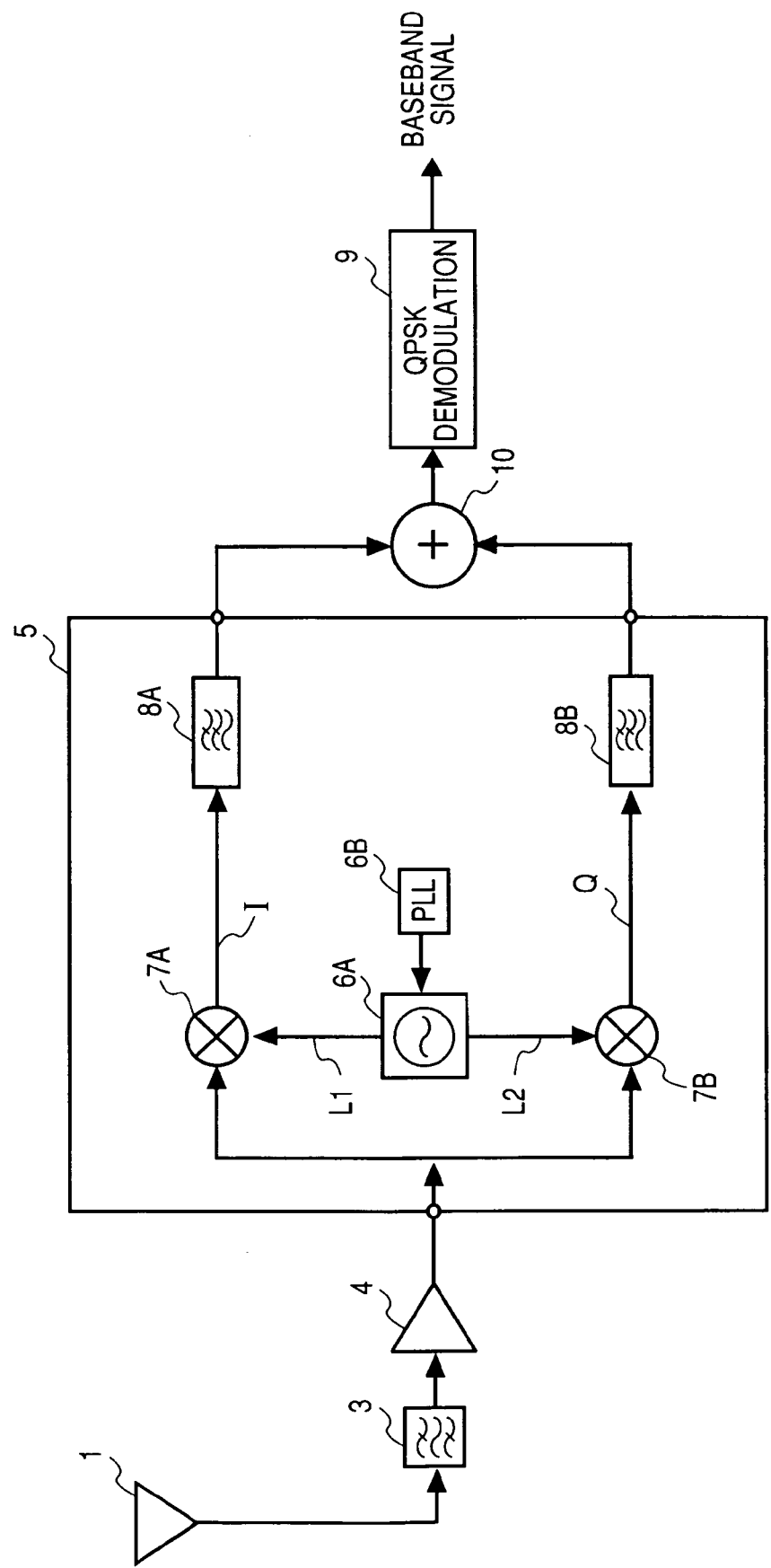

SIGNAL ADDER CIRCUIT CAPABLE OF REMOVING EFFECTS DUE TO PHASE ERROR OR AMPLITUDE ERROR OF I AND Q SIGNALS

BACKGROUND OF THE INVENTION

1. Field of the Invention

The present invention relates to a signal adder circuit that adds I and Q signals having a predetermined phase difference therebetween, and in particular, to a signal adder circuit that can add I and Q signals, even when the I and Q signals have a phase error or an amplitude error, by removing effects due to the phase error or the amplitude error.

2. Description of the Related Art

FIG. 3 is a block diagram schematically showing a digital modulation signal receiver having a signal adder circuit according to the related art. The digital modulation signal receiver includes a quadrature demodulator that extracts a quadrature demodulation signal from a signal received after being quadrature-modulated.

As shown in FIG. 3, a signal received through an antenna 1 is input to a band-pass filter 3, amplified by a variable amplifier 4, and input to a quadrature demodulator 5.

The quadrature demodulator 5 includes a local oscillator 6A that generates local oscillation signals L1 and L2 having predetermined frequencies and having a phase difference of 90° therebetween in accordance with a PLL 6B, and mixers 7A and 7B. The mixers 7A and 7B respectively mix the QPSK modulation signal with the local oscillation signals L1 and L2 output from the local oscillator 6A so as to output an I signal and a Q signal (quadrature demodulation signal) which are quadrature in phase.

The I signal and the Q signal passing through the low pass filters 8A and 8B, respectively, are added by an adder 10 and demodulated to a baseband signal by the QPSK demodulator 9 (for example, refer to JP-A-2000-332841).

It is ideal that the I and Q signals have a phase difference of 90° therebetween and an amplitude difference of 0.

However, the phase difference between the I and Q signals is within a range of 90°±5° due to variation of components included in, for example, the local oscillator 6A that oscillates the local oscillation signal or a phase shifter that rotates the phase of the local oscillation signals by 90°. Thus, the phase error of approximately maximum ±5° is included between the I and Q signals. In addition, the amplitude difference between the I and Q signals does not completely become zero. Thus, the amplitude error of approximately ±5% may be included between the I and Q signals.

When the I and Q signals including the phase error or the amplitude error are added by the adder 10, a baseband signal (added signal) after the adding operation has large error, which has an adverse effect on subsequent signal processing.

SUMMARY OF THE INVENTION

The present invention has been finalized in view of the drawbacks inherent in the conventional signal adder circuit and it is an object of the present invention to provide a signal adder circuit that can generate a baseband signal in which phase error and amplitude error of an I signal and a Q signal are removed even if the I signal and the Q signal have the phase error and the amplitude error.

According to an aspect of the invention, a signal adder circuit includes: an adding unit that includes at least a pair of amplification elements in which a constant current flows between ground-side terminals and a ground, input signals having different phases are input to input terminals, and output terminals to which a power supply voltage is applied are connected to each other; a gain control unit that is provided between the ground and each of the ground-side terminals of the amplification elements so as to adjust the amplitudes of the input signals having different phases; and a phase control unit that is provided between the ground and each of the ground-side terminals of the amplification elements so as to adjust the phases of the input signals having different phases.

In the invention, when adding input signals having different phases, the amplitude error can be removed from the input signals by using the gain control unit and the phase error can be removed by using the phase control unit. Accordingly, the errors included in the added signal can be reduced. Further, in the invention, only one of the amplitude error and the phase error can be removed or both the amplitude error and the phase error can be simultaneously removed.

In the signal adder circuit described above, preferably, a first adding unit includes a first amplification element and a second amplification element, a second adding unit includes a third amplification element and a fourth amplification element, +I signal is input to an input terminal of the first amplification element, +Q signal is input to an input terminal of the second amplification element, the +Q signal being phase-shifted by 90° with respect to the +I signal, −I signal is input to an input terminal of the third amplification element, the −I signal being phase-shifted by 90° with respect to the +Q signal, −Q signal is input to an input terminal of the fourth amplification element, the −Q signal being phase-shifted by 90° with respect to the −I signal, and the gain control unit and the phase control unit are provided between the first amplification element and the third amplification element and between the second amplification element and the fourth amplification element.

In the invention, it is possible to add the signals after removing the amplitude error or the phase error included in the four signals (±I signal and ±Q signal) having different phases.

Further, in the signal adder circuit described above, preferably, the gain control unit includes: fixed resistors that are respectively provided in parallel between a ground terminal of the first amplification element and a ground terminal of the third amplification element and between a ground terminal of the second amplification element and a ground terminal of the fourth amplification element; and a plurality of variable resistor units each including a resistor element and a switching element connected in series to the resistor element.

In the invention, when adding the four signals (±I signal and ±Q signal) having different phases, the gain of each signals can be adjusted. Accordingly, it is possible to reduce the amplitude difference between the signals.

In addition, since a value of the resistor can be gradually varied by switching the switching elements provided in each variable resistor unit, it is possible to perform a fine adjustment with respect to the gain.

Furthermore, in the signal adder circuit described above, preferably, the phase control unit includes: a low pass filter and a high pass filter that are provided between a ground terminal of the first amplification element and a ground terminal of the third amplification element and between a ground terminal of the second amplification element and a ground terminal of the fourth amplification element.

In the invention, when adding the four signals (±I signal and ±Q signal), since the phase of each of the signals can be adjusted, it is possible to reduce phase error other than a predetermined phase difference that is set beforehand for the signals. Further, it is possible to perform an independent phase adjustment such that the phases of the +I and +Q signals lead and the phases of the −I and −Q signals lag.

Furthermore, in the signal adder circuit described above, preferably, the low pass filter includes first and second resistors that are connected in series between the ground-side terminals and a first capacitor provided between the ground and a connection point between the first and second resistors, the high pass filter includes second and third capacitors that are connected in series between the ground-side terminals and a third resistor provided between the ground and a connection point between the second capacitor and the third capacitor, switching elements are respectively provided between one of the ground-side terminals and the first resistor and between one of the ground-side terminals and the second resistor in the low pass filter, and switching elements are respectively provided between one of the ground-side terminals and the first capacitor and between one of the ground-side terminals and the second capacitor in the high pass filter.

In the invention, since each of the low pass filter and the high pass filter is a circuit having two time constants, and it is possible to make steep the slope of a straight line indicating filter characteristic. That is, the low pass filter and the high pass filter can have high cut-off ability.

Furthermore, in the signal adder circuit described above, preferably, the amplification elements are MOSFETs having the ground-side terminals serving as sources, the input terminals serving as gates, and the output terminals serving as drains, respectively.

In the invention, as compared with a case in which a bipolar transistor or a relay is used, the signal adder circuit can be made smaller.

BRIEF DESCRIPTION OF THE DRAWINGS

FIG. 3 is a circuit diagram schematically showing a digital modulation signal receiver having a signal adder circuit according to the related art.

DESCRIPTION OF THE PREFERRED EMBODIMENT

Figure 1:
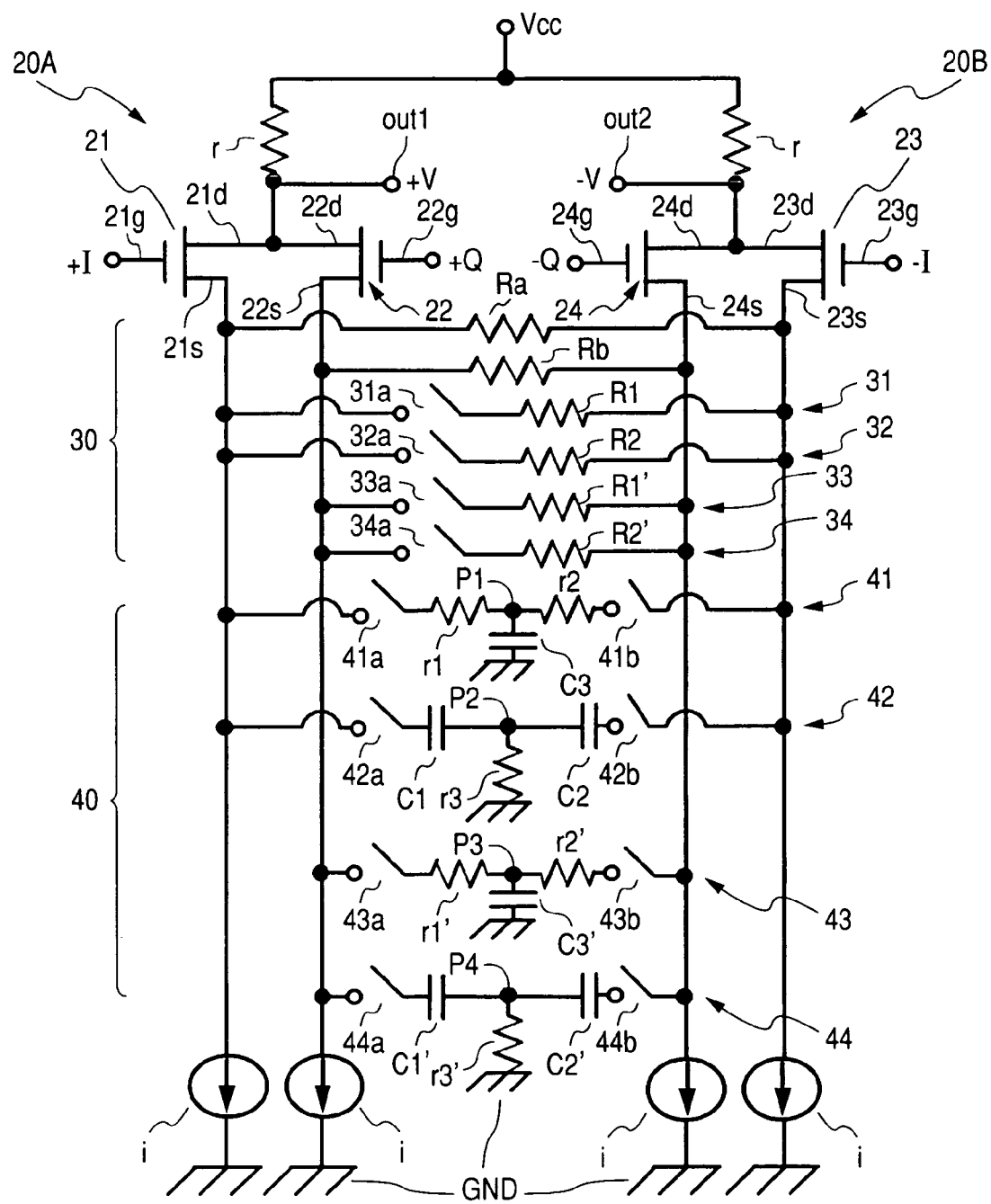
FIG. 1 is a circuit diagram showing the configuration of a signal adder circuit according to a preferred embodiment of the present invention.
Figure 2:
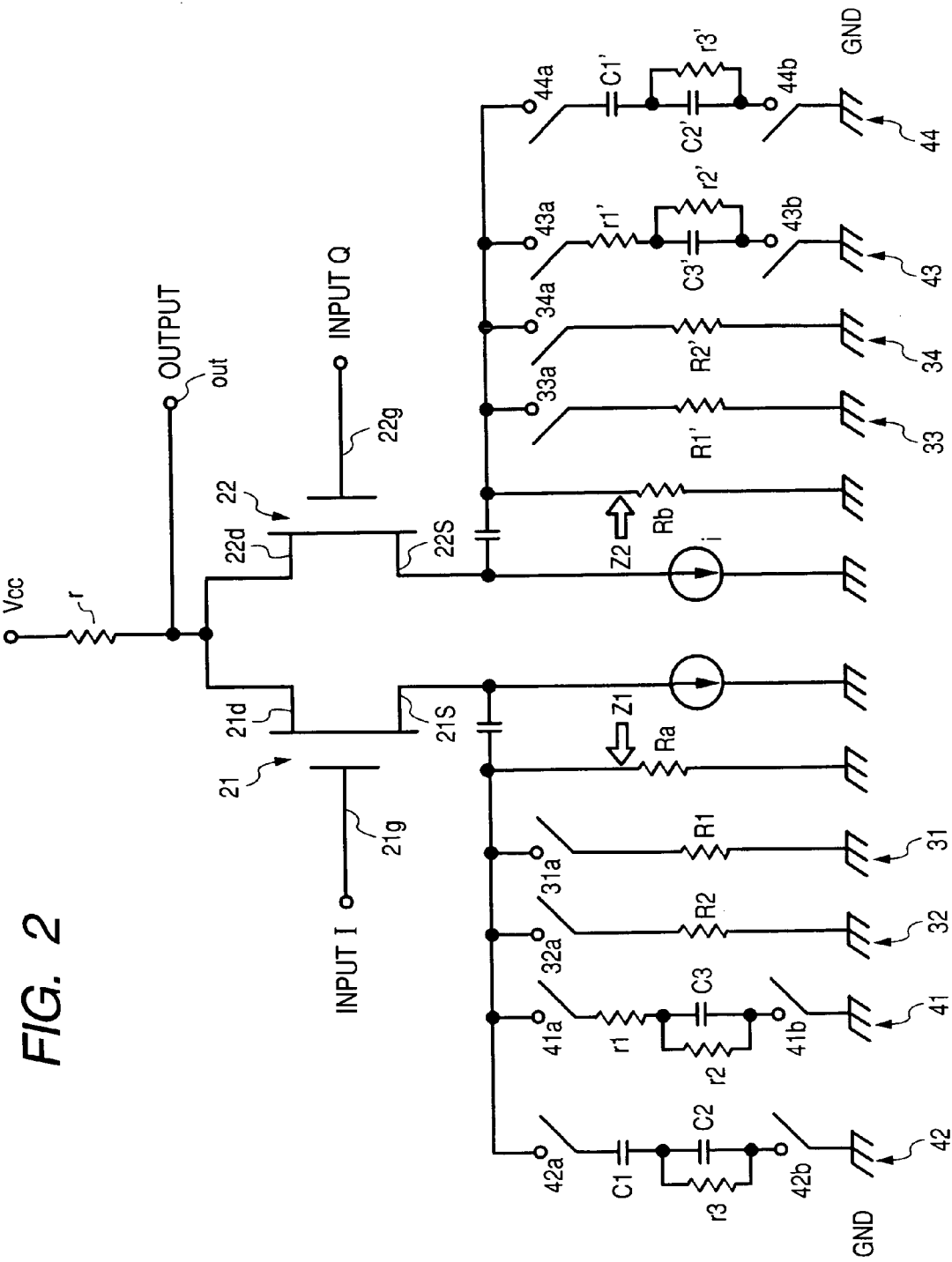
FIG. 2 is a circuit diagram showing an equivalent circuit of the signal adder circuit of FIG. 1.

FIG. 1 is a circuit diagram showing a signal adder circuit according to an embodiment of the present invention and FIG. 2 is a circuit diagram showing an equivalent circuit of the signal adder circuit of FIG. 1. FIG. 2 shows one of two adders.

As shown in FIG. 1, a signal adder circuit 20 mainly includes an adder, a gain control unit, and a phase control unit.

The adder is formed by a semiconductor device such as an MOSFET and includes a first amplification element 21, a second amplification element 22, a third amplification element 23, and a fourth amplification element 24.

A first adder 20A is formed by a pair of the first amplification element 21 and the second amplification element 22 shown in a left upper side of FIG. 1. A second adder 20B is formed by a pair of the third amplification element 23 and the fourth amplification element 24 shown in right upper side of FIG. 1.

The first amplification element 21 is provided for the +I signal, the second amplification element 22 is provided for the +Q signal, the third amplification element 23 is provided for the −I signal, and the fourth amplification element 24 is provided for the −Q signal. That is, the +I signal is input to a gate (input terminal) 21g of the first amplification element 21, the +Q signal is input to a gate (input terminal) 22g of the second amplification element 22, the −I signal is input to a gate (input terminal) 23g of the third amplification element 23, and the −Q signal is input to a gate (input terminal) 24g of the fourth amplification element 24.

In the first adder 20A, a drain (output terminal) 21d of the first amplification element 21 and a drain (output terminal) 22d of the second amplification element 22 are connected to a power supply Vcc through a predetermined pull-up resistor r. In the same way, in the second adder 20B, a drain (output terminal) 23d of the third amplification element 23 and a drain (output terminal) 24d of the fourth amplification element 24 are connected to the power supply Vcc through another predetermined pull-up resistor r. An output terminal out 1 is provided at a connection part between the drain (output terminal) 21d of the first amplification element 21 and the drain (output terminal) 22d of the second amplification element 22 and an output terminal out 2 is provided at a connection part between the drain (output terminal) 23d of the third amplification element 23 and the drain (output terminal) 24d of the fourth amplification element 24.

Further, a constant current (a state having a constant current source i) flows between a ground GND and each of sources (ground-side terminals) 21s, 22s, 23s, and 24s corresponding to the amplification elements.

As shown in FIG. 1, a gain control unit 30 and a phase control unit 40 are provided between the first adder 20A and the second adder 20B.

The gain control unit 30 according to the embodiment the invention includes fixed resistor Ra and Rb, a first variable resistor circuit 31 in which a switching element 31a and a first connection resistor (resistor element) R1 are connected in series to each other, a second variable resistor circuit 32 in which a switching element 32a and a second connection resistor (resistor element) R2 are connected in series to each other, a third variable resistor circuit 33 in which a switching element 33a and a first connection resistor (resistor element) R1' are connected in series to each other, and a fourth variable resistor circuit 34 in which a switching element 34a and a second connection resistor (resistor element) R2' are connected in series to each other.

The fixed resistor Ra, the first variable resistor circuit 31, and the second variable resistor circuit 32 are connected in parallel between the source (ground terminal) 21s of the first amplification element 21 and the source (ground terminal) 23s of the third amplification element 23. Further, the fixed resistor Rb, the third variable resistor circuit 33, and the fourth variable resistor circuit 34 are connected in parallel between the source (ground terminal) 22s of the second amplification element 22 and the source (ground terminal) 24s of the fourth amplification element 24.

Each of the switching elements 31a, 32a, 33a, and 34a may be formed by, for example, a MOSFET, bipolar transistor, or a relay contact. However, the switching elements 31a, 32a, 33a, and 34a according to the embodiment of the invention are controlled to be opened or closed by applying a signal from an outside.

On the other hand, the phase control unit 40 according to the embodiment includes a first low pass filter 41, a first high pass filter 42, a second low pass filter 43, and a second high pass filter 44.

The fist low pass filter 41 and the first high pass filter 42 are connected in parallel between the source (ground terminal) 21s of the first amplification element 21 and the source (ground terminal) 23s of the third amplification element 23. Further, the second low pass filter 43 and the second high pass filter 44 are connected in parallel between the source (ground terminal) 22s of the second amplification element 22 and the source (ground terminal) 24s of the fourth amplification element 24.

The first low pass filter 41 includes a first resistor r1, a second resistor r2 to which one end thereof is connected in series with one end of the first resistor r1, and a capacitor C3 connected between a connection point P1 of the first resistor r1 and the second resistor r2 and a ground. A switching element 41a is provided between the other end of the first resistor r1 and the source (ground terminal) 21s of the first amplification element 21. A switching element 41b is provided between the other end of the second resistor r2 and the source (ground terminal) 23s of the third amplification element 23. On the other hand, the first high pass filter 42 includes a first capacitor C1 and a second capacitor C2 in which one end thereof is connected in series with one end of the first capacitor C1, and a third resistor r3 connected between the connection point P2 and a ground. A switching element 42a is provided between the other end of the first capacitor C1 and the source (ground terminal) 21s of the first amplification element 21. A switching element 42b is provided between the other end of the second capacitor C2 and the source (ground terminal) 23s of the third amplification element 23.

In the same way, the second low pass filter 43 includes a first resistor r1', a second resistor r2' to which one end thereof is connected in series with one end of the first resistor r1', and a capacitor C3' connected between a connection point P3 of the first resistor r1' and the second resistor r2' and a ground. A switching element 43a is provided between the other side of the first resistor r1' and the source (ground terminal) 22s of the second amplification element 22. A switching element 43b is provided between the other end of the second resistor r2' and the source (ground terminal) 24s of the fourth amplification element 24. On the other hand, the second high pass filter 44 includes a first capacitor C1' and a second capacitor C2' in which one end thereof is connected in series with one end of the first capacitor C1', and a third resistor r3' connected between the connection point P4 of the first capacitor C1' and the second capacitor C2' and a ground. A switching element 44a is provided between the other end of the first capacitor C1' and the source (ground terminal) 22s of the second amplification element 22. A switching element 44b is provided between the other end of the second capacitor C2' and the source (ground terminal) 24s of the fourth amplification element 24.

The first low pass filter 41 functions as a phase-lag circuit by closing the switching element 41a and the switching element 41b (ON state). The second low pass filter 43 also functions as a phase-lag circuit by closing the switching element 43a and the switching element 43b (ON state). Further, the first high pass filter 42 functions as a phase-lead circuit by closing the switching element 42a and the switching element 42b (ON state). The second high pass filter 44 functions as a phase-lead circuit by closing the switching element 44a and the switching element 44b (ON state).

An operation of the signal adder circuit will be described.

An equivalent circuit diagram as shown in FIG. 2 can be obtained by focusing on one part of the two groups of adders included in the signal adder circuit shown in FIG. 1. Hereinafter, even though the adder will be described by using the first adder 20A, the description on the adder 20B is the same with the adder 20A.

In FIG. 2, the relationship among the fixed resistor Ra and Rb, the first connection resistors (resistor element) R1 and R1', and the second connection resistors (resistor element) R2 and R2' is defined as, for example, R=Ra=Rb=R1=R1'=2*R2=2*R2' (that is, Ra=Rb=R1=R1'=R and R2=R2'=R/2).

First, a gain control (amplitude adjustment) operation will be described.

When all of the switching elements are opened (OFF state), a value of impedance Z1 between the source (ground terminal) 21s of the first amplification element 21 and the ground is the same with a value of the fixed resistor Ra (Z1=Ra=R) and a value of impedance Z2 between the source (ground terminal) 22s of the second amplification element 22 and the ground is the same with a value of the fixed resistor Rb (Z2=Rb=R).

Next, when only the switching element 31a is converted to the ON state, since the fixed resistor Ra is connected in parallel to the first connection resistor (resistor element) R1, the value of the impedance Z1 can be set to 1/Z1=1/Ra+1/R1=1/R+1/R, that is, Z1=R/2. Sequentially, if the switching element 32a is converted to the ON state, since the second connection resistor (resistor element) R2 is also connected in parallel to the fixed resistor Ra and the first connection resistor (resistor element) R1, Z1 can be set to 2R/5. In addition, when the switching element 31a is opened and only the switching element 32a is converted to the ON state, Z1 can be set to 2R/3.

In the same way, when only the switching element 33a is converted to the ON state, the value of the impedance Z2 can be set to R/2. When only the switching element 34a is converted to the ON state, the value of the impedance Z2 can be set to 2R/3. When both the switching elements 33a and 34a are converted to the ON state, the value of the impedance Z2 can be set to 2R/5.

That is, it is possible to gradually and independently convert the impedances Z1 and Z2 by switching each of the switching elements.

Therefore, even when the amplitude error is generated between the amplitude of the I signal input to the gate 21g of the first amplification element 21 and the Q signal input to the gate 22g of the second amplification element 22, since it is possible to change a gain of the first amplification element 21 by switching the switching elements 31a and 32a of the first amplification element 21, it is possible to adjust the size of the amplitude of the I signal output to the drain (output terminal) 21d such that the amplitude of the I signal can be the same with or similar to the Q signal.

Further, when the switching elements 33a and 34a of the second amplification element 22 are switched, since it is possible to change a gain of the second amplification element 22, it is possible to adjust the size of the amplitude of the Q signal output to the drain (output terminal) 22d such that the amplitude of the Q signal can be the same with or similar to the I signal.

The gains of the first amplification element 21 and the second amplification element 22 can be adjusted by switching the switching elements 31a and 32a of the first amplification element 21 and the switching elements 33a and 34a of the second amplification element 22. Accordingly, the sizes of the amplitude of the Q signal and the I signal can be the same with or similar to each other.

That is, the amplitudes of the I signal and the Q signal can be the same with or similar to the each other by switching one of or both of the switching elements 31a and 32a of the first amplification element 21 and the switching elements 33a and 34a of the second amplification element 22. Accordingly, the amplitude error between the I signal and the Q signal can be reduced.

Next, a phase control (phase adjustment) operation will be described.

For example, when the Q signal leads the I signal (in a case of lead phase), in order to reduce the phase error between both signals, the I signal should be led or the Q signal should lag.

Here, when the switching elements 42a and 42b provided to the both ends of the first high pass filter 42 are closed, since the first high pass filter 42 functions as the phase-lead circuit, the I signal can be led. Further, the I signal can be the same with or similar to the Q signal by selecting an element having desired values for the first capacitor C1, the second capacitor C2, and the third resistor r3, each of which are included in the first high pass filter 42. Accordingly, the phase error between the I signal and the Q signal can be reduced.

On the other hand, when the switching elements 43a and 43b provided to the both ends of the second low pass filter 43 are closed, since the second low pass filter 43 functions as the phase-lag circuit, the Q signal can lag.

Further, the Q signal can be the same with or similar to the I signal by selecting an element having desired values for the first resistor r1', the second resistor r2', and the third capacitor C3', each of which are included in the second low pass filter 43. Accordingly, the phase error between the I signal and the Q signal can be reduced.

On the other hand, when the I signal leads the Q signal (in a case of lag phase), in order to reduce the phase error between both signals, the I signal should lag or the Q signal should be led.

Here, when the switching elements 41a and 41b provided to the both ends of the first low pass filter 41 are closed such that the first low pass filter 41 functions as the phase-lag circuit, the I signal can lag. Further, the Q signal can be led by closing the switching elements 44a and 44b provided both ends of the second high pass filter 44 such that the second high pass filter 44 functions as phase-lead circuit.

In the above-described case, the I signal can be the same with or similar to the Q signal by selecting an element having desired values for the first resistor r1, the second resistor r2, and the third capacitor C3, each of which are included in the first low pass filter 41 or by selecting an element having desired values for the first capacitor C1', the second capacitor C2', and the third resistor r3', each of which are included in the second high pass filter 44. Accordingly, the phase error between the I signal and the Q signal can be reduced.

According to a degree of the phase error generated between the I signal and the Q signal, the first high pass filter (phase-lead circuit for the I signal) 42 may be operated together with the second low pass filter (phase-lag circuit for the Q signal) 43 so as for the I signal and the Q signal to be close to each other. Further, the first low pass filter (phase-lag circuit for the I signal) 41 may be operated together with the second high pass filter (phase-lead circuit for the Q signal) 44 so as for the I signal and the Q signal to be close to each other.

Occasionally, while operating the first high pass filter (phase-lead circuit for the I signal) 42 and the second high pass filter (phase-lead circuit for the Q signal) 44, the first low pass filter (phase-lag circuit for the I signal) 41 and/or the low pass filter (phase-lag circuit for the Q signal) 43 can be operated.

That is, the I signal and the Q signal can be close to each other by independently operating each of the filters 41, 42, 43, and 44 or by grouping and operating the filters 41, 42, 43, and 44. Accordingly, the phase error between the I signal and the Q signal can be reduced.

In the gain control unit 30 and the phase control unit 40, the +I signal and the +Q signal are added by the first adder 20A while the amplitude error and the phase error between the +I signal and the +Q signal is kept by zero. The added result is output from the output terminal out1 in a form of a +V signal. Similarly, in the gain control unit 30 and the phase control unit 40, the −I signal and the −Q signal are added by the second adder 20B while the amplitude error and the phase error between the −I signal and the −Q signal is kept by zero. The added result is output from the output terminal out2 in a form of a −V signal. The +V signal output form the output terminal out1 and the −V signal output form the output terminal out2 are demodulated to a baseband signal by using the QPSK demodulator (not shown).

The first adder 20A and the second adder 20B shares the same gain control unit 30 and the phase control unit 40. Accordingly, each of the amplitude and phase corresponding to the +V signal output form the first adder 20A and the −V signal output form the second adder 20B, respectively, can be the same with each other.

Accordingly, the errors included in the baseband signal generated by the QPSK demodulator can be reduced and it is possible to restrict erroneous effect to the signal process thereafter.

In the embodiment according to the invention, a case that two variable resistors each of which includes the first amplification element 21, the second amplification element 22, the resistor element R1, R2, and so on, and the switching elements 31a, 32b, and so on, each of which are connected in series with one another have been described. However, the present invention is not limited thereto and may have larger number of resistors. The more the number of the variable resistors is provided, the more fine adjustment (more meticulous gain control) can be performed so as to reduce the amplitude error between the I signal and the Q signal.

In the embodiment according to the invention, the signal adder circuit including four kinds of filters, that is, first amplification element 21 has the first low pass filter (phase-lag circuit for the I signal) 41 and the first high pass filter (phase-lead circuit for the I signal) 42 and the second amplification element 22 has the second low pass filter (phase-lag circuit for the Q signal) 43 and the second high pass filter (phase-lead circuit for Q signal) 44 has been described. However, the invention is not limited thereto. That is, a plurality of filters each of which has different lead-amount and lag-amount may be provided by changing the values of the elements (resistor and capacitor) included in each of the filters. The more the number of the low pass filter and the high pass filter is provided, the fine adjustment (more meticulous gain control) can be performed so as to reduce the phase error between the I signal and the Q signal.

In order to exemplify the embodiment, the signal adder circuit including both the gain control unit and the phase control unit has been described. However, according to a need, the signal adder circuit may have one of the gain control unit and the phase control unit.

According to this configuration, even when the phase error or amplitude error exist between the I signal and Q signal, the signal adder circuit according to the present invention can generate an added signal (baseband signal) which is less affected by the phase error or the amplitude error by removing the phase error and the amplitude error.

In particular, even when the QPSK modulation type receiver uses four signals (+I signal, −I signal, +Q signal, and −Q signal) each of which are phase-shifted by 90 degrees, it is possible to generate a baseband signal in which the phase error and the amplitude error are removed from the four signals.

The invention claimed is:

1. A signal adder circuit comprising:
an adding unit that includes at least a pair of amplification elements in which a constant current flows between ground-side terminals and a ground, input signals having different phases are input to input terminals, and output terminals to which a power supply voltage is applied are connected to each other;
a gain control unit that is provided between the ground and each of the ground-side terminals of the amplification elements so as to adjust amplitudes of output signals having different phases; and
a phase control unit that is provided between the ground and each of the ground-side terminals of the amplification elements so as to adjust phases of the output signals having different phases.

2. A signal adder circuit comprising:
a first adding unit that includes at least a pair of first and second amplification elements having ground-side terminals in which a constant current flows between the ground-side terminals and a ground, input terminals to which input signals having different phases are input, and output terminals connected to each other to which a power supply voltage is applied; and
a second adding unit that includes at least a pair of third and fourth amplification elements having ground-side terminals in which a constant current flows between the ground-side terminals and a ground, input terminals to which input signals having different phases are input, and output terminals connected to each other to which a power supply voltage is applied,
wherein
+I signal is input to an input terminal of the first amplification element,
+Q signal is input to an input terminal of the second amplification element, the +Q signal being phase-shifted by 90° with respect to the +I signal,
−I signal is input to an input terminal of the third amplification element, the −I signal being phase-shifted by 90° with respect to the +Q signal,
−Q signal is input to an input terminal of the fourth amplification element, the −Q signal being phase-shifted by 90° with respect to the −I signal, a gain control unit and a phase control unit are provided between the first amplification element and the third amplification element and between the second amplification element and the fourth amplification element,
the gain control unit adjusts amplitudes of output signals of the first adding unit and output signals of the second adding unit, and
the phase control unit adjusts phases between the output signals of the first adding unit and the output signals of the second adding unit.

3. The signal adder circuit according to claim 2,
wherein the gain control unit includes:
fixed resistors that are respectively provided in parallel between a ground terminal of the first amplification element and a ground terminal of the third amplification element and between a ground terminal of the second amplification element and a ground terminal of the fourth amplification element; and
a plurality of variable resistor units each including a resistor element and a switching element connected in series to the resistor element.

4. The signal adder circuit according to claim 2, wherein the phase control unit includes:
a low pass filter and a high pass filter that are provided between a ground terminal of the first amplification element and a ground terminal of the third amplification element and between a ground terminal of the second amplification element and a ground terminal of the fourth amplification element.

5. The signal adder circuit according to claim 4,
wherein the low pass filter includes first and second resistors that are connected in series between the ground-side terminals and a first capacitor provided between the ground and a connection point between the first and second resistors,
the high pass filter includes second and third capacitors that are connected in series between the ground-side terminals and a third resistor provided between the ground and a connection point between the second capacitor and the third capacitor,
in the low pass filter, switching elements are respectively provided between one of the ground-side terminals and the first resistor and between one of the ground-side terminals and the second resistor, and
in the high pass filter, switching elements are respectively provided between one of the ground-side terminals and the first capacitor and between one of the ground-side terminals and the second capacitor.

6. The signal adder circuit according to claim 2,
wherein the amplification elements are MOSFETs having the ground-side terminals serving as sources, the input terminals serving as gates, and the output terminals serving as drains, respectively.

* * * * *